United States Patent [19]

Sordello et al.

[11] 4,003,000

[45] Jan. 11, 1977

[54] SINUSOIDAL OSCILLATOR WITH ELECTRONICALLY VARIABLE FREQUENCY

[75] Inventors: Frank J. Sordello, Los Gatos; Robert L. Cloke, Santa Clara, both of Calif.

[73] Assignee: Sperry Rand Corporation, New York, N.Y.

[22] Filed: May 27, 1975

[21] Appl. No.: 581,091

[52] U.S. Cl. .................... 331/117 R; 331/177 R
[51] Int. Cl.² .................. H03B 3/04; H03B 5/12
[58] Field of Search ............. 331/117 R, 167–171, 331/177 R

[56] References Cited

UNITED STATES PATENTS

| 3,076,945 | 2/1963 | Coombs | 331/177 R X |
| 3,436,681 | 4/1969 | Hart | 331/117 R |

*Primary Examiner*—Siegfried H. Grimm
*Attorney, Agent, or Firm*—Gerald L. Moore

[57] ABSTRACT

A sinusoidal oscillator including means for electronically varying the frequency of oscillation by altering the phase angle of the amplifier circuit phase shift.

10 Claims, 7 Drawing Figures

SINUSOIDAL OSCILLATOR WITH ELECTRONICALLY VARIABLE FREQUENCY

BACKGROUND OF THE INVENTION

Oscillators usually are of two broad general types namely, the non-sinusoidal wave type and the sinusoidal wave type. The non-sinusoidal type, typically a squarewave or a sawtooth wave oscillator, has frequently been used when it was desired to provide the ability to vary the frequency of oscillation within predetermined limits. The frequency variation is achieved by varying the ramp currents in the circuit which in turn changes the duration of the ramp signal and therefore the frequency of the oscillator. However, problems have always existed in such oscillators because of the generation of harmonic frequencies and noise. Because of the necessity of changing the slope of the ramp signals frequently and abruptly, there exists the tendency to not only generate noise but generate the many harmonics of the basic frequency desired. Thus the application of non-sinusoidal oscillators has been limited to areas where the harmonic frequencies and noise could be endured or otherwise extensive steps must be taken to suppress and filter out the unwanted signals. Still the necessity to use the non-sinusoidal oscillator has existed because of the need to vary the frequency of oscillation.

In contrast, sinusoidal type oscillators have not been plagued with the generation of noise and harmonic frequencies in the manner previously described with respect to sawtooth oscillators because of the basic usage of an internal waveform approaching the sinusoidal waveform. Thus from this standpoint the sinusoidal oscillator has been applied whenever possible to those applications requiring quiet and clean signal forms. However, the frequency of oscillation of a sinusoidal oscillator can vary with the values of the components within the circuit. In other words, the frequency of oscillation is directly dependent on the component values and therefore the accuracy with which one can make a sinusoidal oscillator oscillate at a predetermined frequency depends upon the accuracy with which one can manufacture the components that go into the circuit.

To provide a variable frequency sinusoidal oscillator the usual method has been to utilize a Varicap in the feedback circuit to vary the phase angle and thus shift the resonant frequency of the oscillator. Difficulties arise in that Varicaps require a high dc voltage and small oscillatory voltages for operation and since the overall frequency of oscillation depends upon the reactive values of all the components, the frequency of oscillation is further dependent upon the accuracy and tolerances to which these components were held. Thus there remains to be provided an effective variable frequency oscillator of the sinusoidal type and it is to this purpose that the subject invention is directed.

SUMMARY OF THE INVENTION

A variable frequency sinusoidal oscillator including an amplifying system having a feedback circuit and means to detect the frequency of oscillation of the oscillator. The amplifying system and the feedback circuit include means for generating an aggregate phase shift of zero or an integral multiple of 360° for altering the phase of the signals passing therethrough such that the oscillator will oscillate at a given frequency, with means to vary the phase shift in the amplifying system thereby to vary the frequency at which the oscillator will oscillate.

DESCRIPTION OF THE INVENTION

Figure 1:
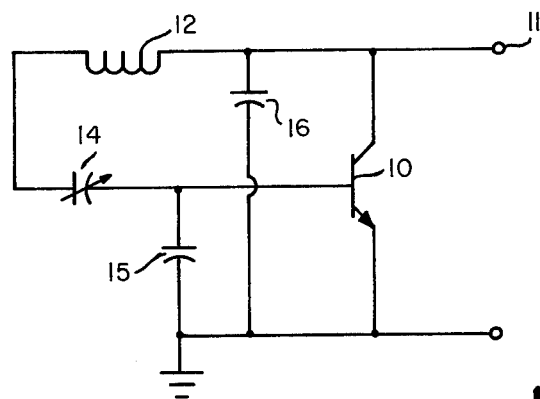
FIG. 1 shows a prior art variable frequency sinusoidal oscillator without dc supply connections.

In FIG. 1 a prior art oscillator of the sinusoidal type is illustrated including an amplifier device shown as a transistor 10, connected to supply an output signal at the terminal 11. This is a typical Clapp type oscillator wherein a feedback circuit is connected between the collector and the base of the transistor including an inductor 12 and a variable capacitor or Varicap 14. The emitter is connected to ground. In the emitter base circuit is a second capacitor 15 and across the collector and emitter is a third capacitor 16.

Figure 2:
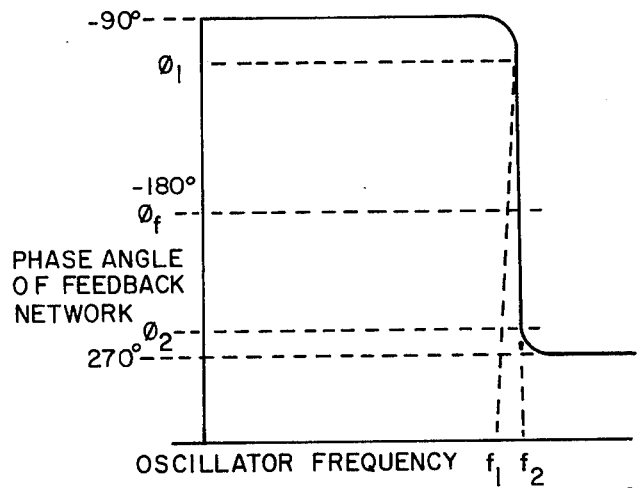
FIG. 2 is a typical frequency response curve for the feedback network of the circuit of FIG. 1.

The frequency of oscillation of such a circuit is dependent upon the summation of the phase shifts in the feedback circuit including the inductor 12, the Varicap 14 and capacitors 15 and 16, as well as the phase shift of the amplifier device 10. Naturally the frequency of oscillation depends upon the values of the components in these circuits and therefore the predictability of the frequency of oscillation depends upon the tolerance to which the values of these components is held. To reduce the effect of changes in the phase angle of the amplifier on the frequency of oscillation it is usually attempted to make the rate of change of phase with respect to frequency, i.e. $d\phi/df$ large, such that changes in the phase angle of the amplifier and its dominant collector load, capacitor 16, will have a lesser effect on the resonant frequency of the circuit. Therefore as shown in FIG. 2, a relatively large phase angle change, say from $\phi_1$ to $\phi_2$, will result only in a small frequency change from $f1$ to $f2$. However, in reality, one can only maintain such a frequency response curve if the intrinsic resistive values of the circuit are maintained low, i.e. the circuit has a high Q. With the greater resistance in the feedback circuit the curve tends to flatten out more since that rate of change of frequency with the change in phase becomes greater. In other words the slope of the curve from $\phi_1$ to $\phi_2$ decreases.

In accordance with the present invention there is provided a sinusoidal oscillator including an amplifier system and means for changing the phase shift in the amplifier system while maintaining the feedback circuit and output circuit components constant. Such a phase change in the amplifier system enables the varying of the frequency of oscillation of the oscillator electronically thereby providing an electronically variable frequency sinusoidal oscillator.

Figure 3:
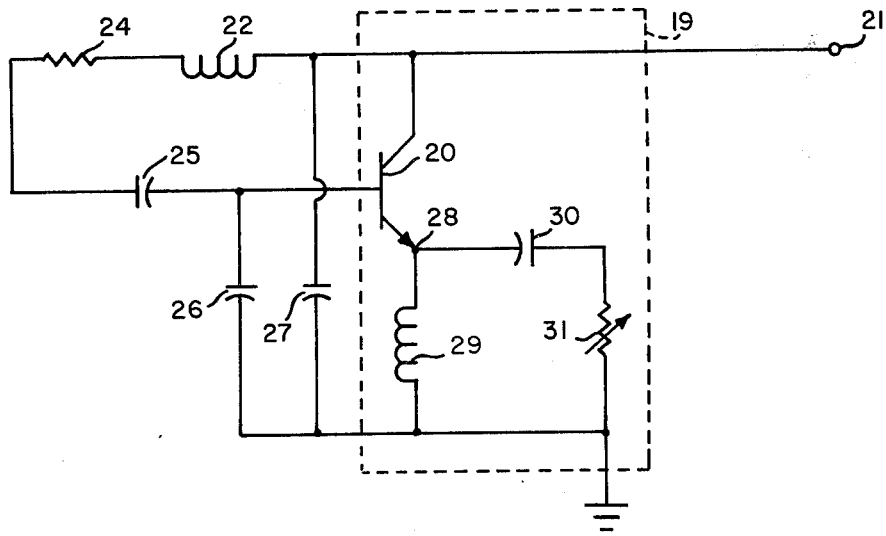
FIG. 3 is a first embodiment of the invention showing the circuit without the various dc supply components.

In FIG. 3 is shown a first embodiment of the invention including an amplifier system 19 having a transistor 20. The collector thereof is connected to an output terminal 21 and also is connected through the feedback circuit including a fixed value inductor 22, a fixed value resistor 24 and a fixed value capacitor 25 to the base thereof. A fixed value capacitor 26 is connected between the base of the transistor and the ground and a fixed value capacitor 27 is connected between ground and the collector thereof.

In accordance with the present invention there is provided in the amplifier system means for varying the phase angle of the output current for the purpose of varying the oscillating frequency of the circuit within a predetermined frequency range. For this purpose the emitter 28 of the transistor includes in parallel connection to ground the components including the fixed value inductor 29 in parallel connection with a fixed value capacitor 30 and a variable resistor 31.

Thus in operation it can be seen that there is provided a feedback circuit including the inductor 22, the resistor 24 and the capacitor 25 connected between the collector and base of the transistor and the capacitors 26 and 27 connected from base to ground and collector to ground respectively. In addition, in the transistor amplifier system there is included parallel circuits connecting the emitter to ground including the inductor 29 in parallel connection with a series circuit including the capacitor 30 and the variable resistor 31.

Figure 4A:
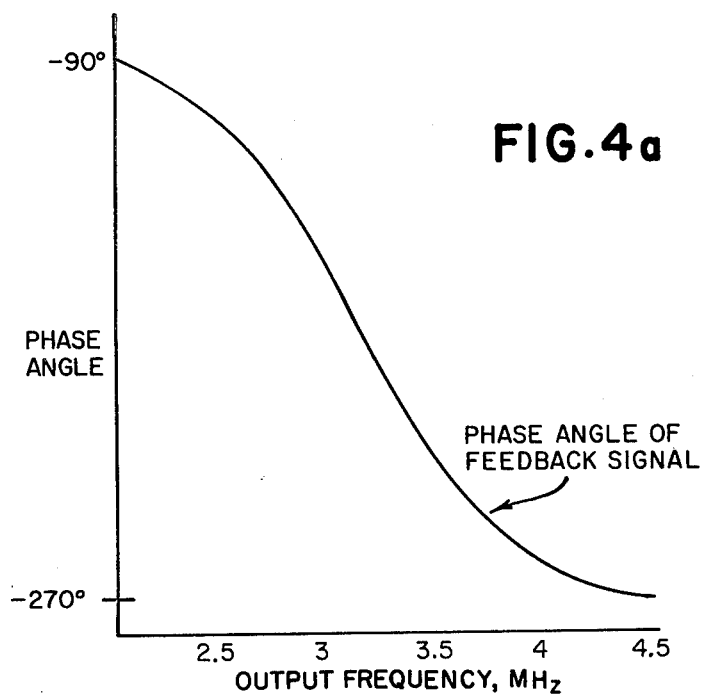
FIG. 4a shows a typical curve of the phase angle of the feedback signal vs. frequency.
Figure 4B:
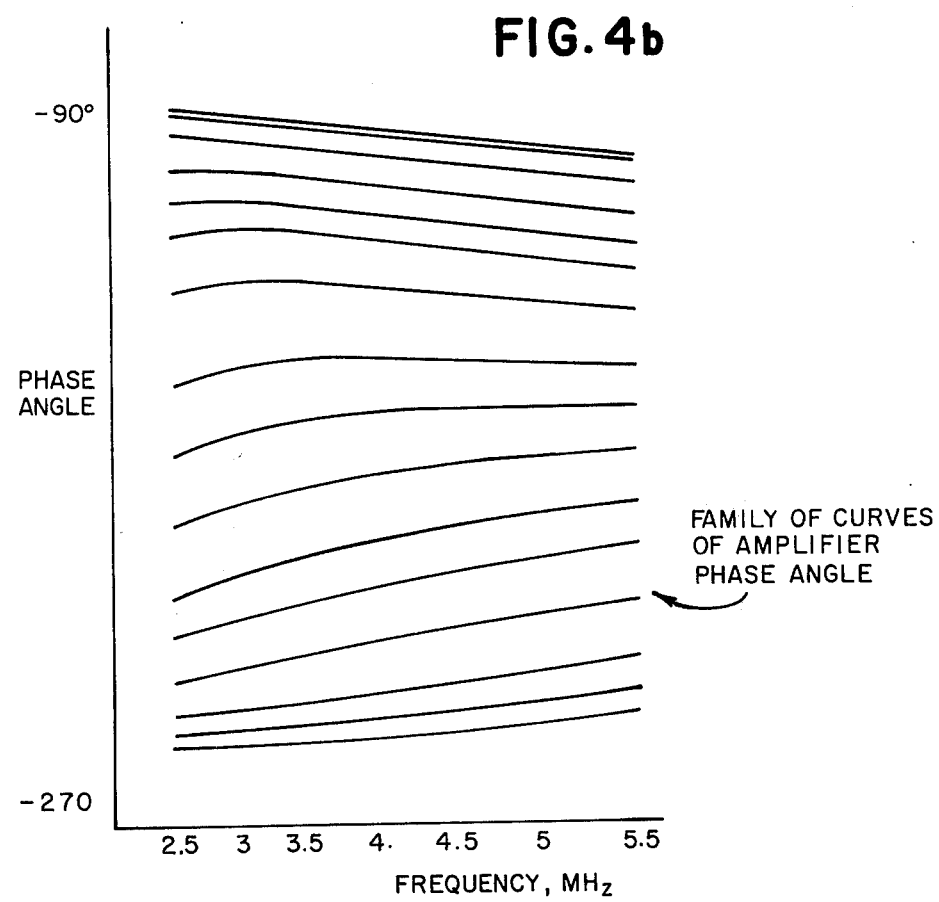
FIG. 4b shows a typical family of curves representing the amplifier phase angle vs. frequency.
Figure 4C:
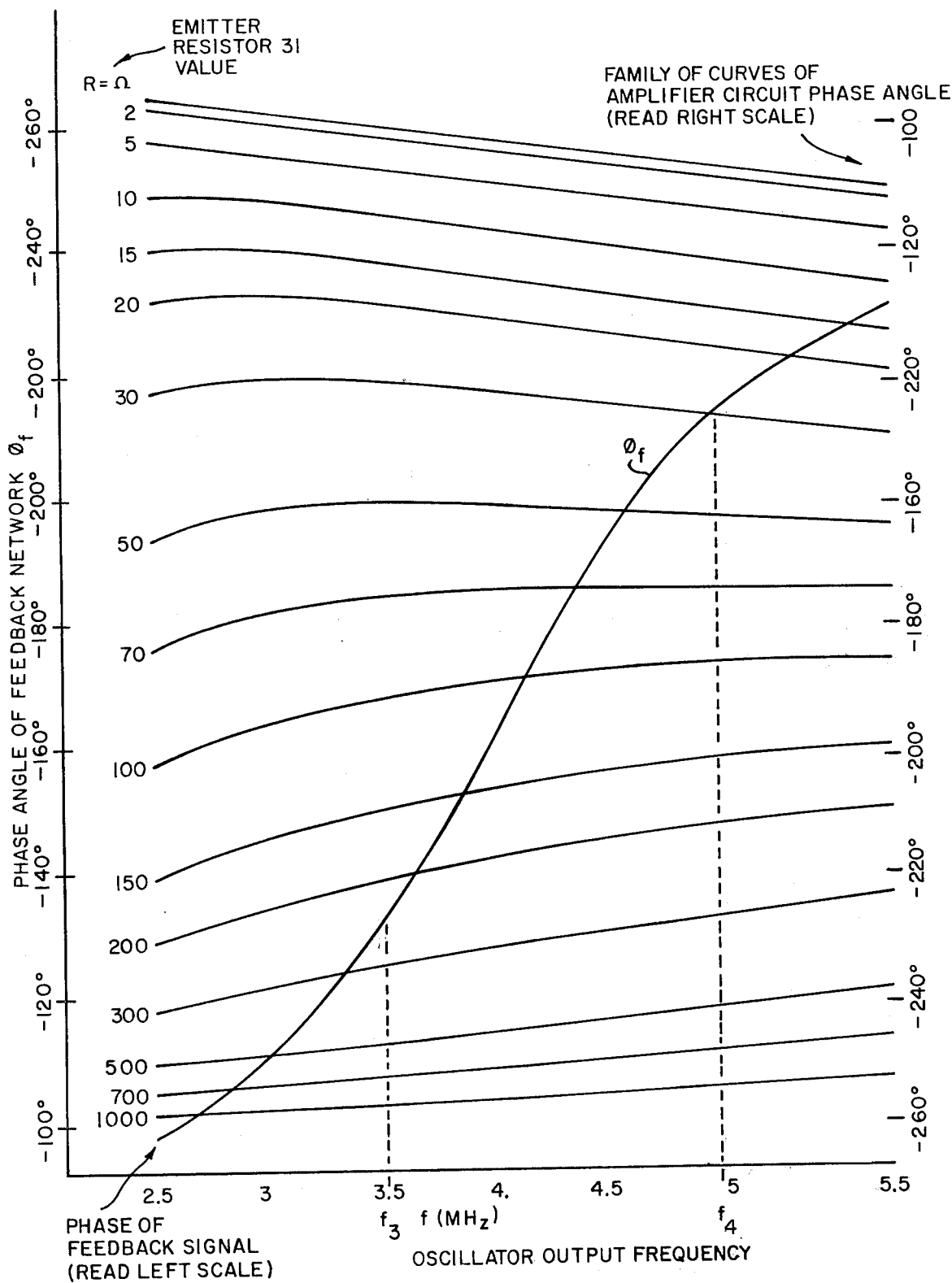
FIG. 4c shows a typical frequency response curve for the circuit of FIG. 3.

Turning now to the frequency response curve in FIG. 4c showing a plotting of the phase angles of the circuit versus output frequency, there is shown as $\phi_f$ a plot of the phase angle of the feedback network including the inductor 22, the resistor 24 and the capacitors 25, 26 and 27. For each value of the resistor 24 the configuration of this phase angle plot changes — in other words, as the resistor value is increased, the slope of the portion of the curve extending between $f_3$ and $f_4$ decreases thereby decreasing $d\phi/df$.

However, as explained heretofore, the oscillation frequency of this circuit is varied by changing the phase angle $\phi A$ of the circuit of the amplifier system which in this case is varied by changing the value of the resistor 31. For this purpose you will see that a family of phase angle plots, FIG. 4b, are shown with each representing the phase angle obtained as a result of varying the value of the resistance 31 with the phase angle of the amplifier system being listed on the scale to the left.

FIG. 4c combines the family of amplifier phase angle plots from FIG. 4b with an inverted reproduction of the feedback phase angle plot, FIG. 4a, such that at all points of intersection, the sum of phase angles equals −360° which is the condition for oscillation. Of course the value of the resistance 24 can also be changed thereby making it possible to alter the range of frequency change by changing the resistive content of the feedback circuit. Thus with the higher value of feedback circuit resistance, the $d\phi/df$ decreases and for lesser values of resistance the slope increases. Thus it can be seen that by varying the phase angle of the amplifier system circuit, the oscillation frequency of the total circuit can be altered. As pointed out before, it is somewhat easier and much more useful and practical to vary this phase angle electronically.

Figure 5:
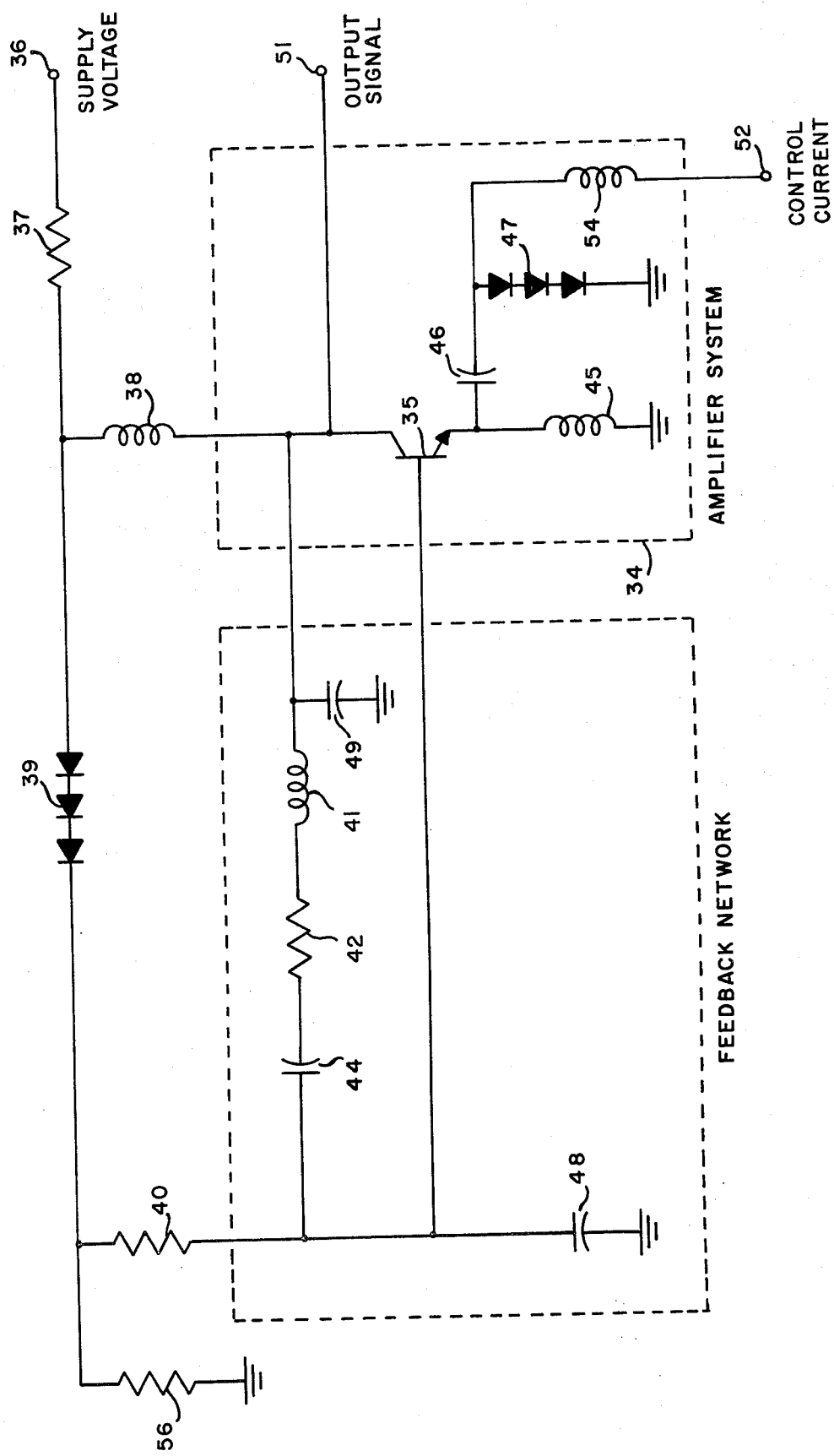
FIG. 5 shows one implementation of the circuit of FIG. 3.

Turning now to FIG. 5 there is shown a further embodiment of the invention illustrating both the AC circuitry and the DC power circuitry necessary for the proper functioning of the circuit. Herein is shown an amplifier system 34 including the transistor 35 being energized from a supply voltage source (not shown) connected to a terminal 36, a collector current through the resistor 37 and an RF choke 38. In addition there is supplied a base current through the diodes 39 and the resistor 40. In this circuit the feedback circuit includes the fixed value inductor 41, the resistor 42 and the fixed value capacitor 44 connected between the collector and the base of the transistor 35. Between ground and the base there is connected the fixed value capacitor 48 and between the collector and ground the fixed value capacitor 49. In the emitter circuit of the amplifier system there is included a fixed value inductor 45 in parallel connection with a fixed capacitor 46 and a plurality of series connected diodes 47.

Thus as explained heretofore, the oscillator output frequency $f_o$ of the total circuit which appears at the means for detecting the oscillator frequency, namely the output terminal 51, is dependent upon the relationship of the phase angles between the feedback circuit including the inductor 41, the resistor 42, the capacitor 44 and the capacitors 48 and 49 and the phase angle of the amplifier system 34 including the capacitor 46 and the bank of diodes 47 in parallel connection with the inductor 45 connected to ground. In this circuit the resistance change in the amplifier system is effected by control of the current signal introduced at the terminal 52. This current signal is passed through an inductor 54 for isolation of AC and DC currents and utilized to vary the resistance value of the bank of diodes 47. As is well known the incremental current resistance of any silicon diode is approximately equal to 26 ohms divided by the current passing therethrough in milliamps. Therefore by supplying and controlling the introduction of current at the terminal 52 the resistive value of the diodes 47 is predictably adjusted to regulate the resistance in the amplifier system circuit. By doing so, the phase angle of the amplifier system is varied which in turn and as explained heretofore, varies the oscillation frequency of the overall circuit which frequency $f_o$ appears at the terminal 51.

Thus it can be seen that there is provided an electronically controlled variable frequency sinusoidal oscillator having an output frequency dependent upon the value of the current input at the terminal 52. Thus by providing means for controlling such current input, the frequency of the oscillator is regulated electronically. In addition, by providing a variable resistor 42 and controlling the value of that resistance, the $d\phi/df$ is changed thereby setting the range through which the output frequency can be changed by regulation of the phase angle of the amplifier circuit.

The invention claimed is:

1. A variable frequency sinusoidal oscillator comprising:
    an amplifier system;
    a feedback circuit for the amplifier system, said feedback circuit and said amplifier system including means for causing a phase shift of three hundred sixty degrees in signals transmitted therethrough such that the oscillator will oscillate at a given frequency;
    means to detect the oscillation frequency of the oscillator; and
    reactive circuit means connecting with the transistor to vary the phase shift of the amplifier gain thereby to vary the oscillation frequency of the oscillator within a predetermined frequency range.

2. A variable frequency sinusoidal oscillator as defined in claim 1 wherein said feedback circuit includes a variable resistance whereby by changing the value of said feedback circuit resistance the frequency range is changed.

3. A variable frequency sinusoidal oscillator as defined in claim 1 wherein said amplifier system includes a transistor connected to amplify the signal transmitted therethrough.

4. A variable frequency sinusoidal oscillator as defined in claim 3 wherein said amplifier system includes a variable resistance in the emitter circuit of the amplifier which when regulated will vary the phase shift of the amplifier system.

5. A variable frequency sinusoidal oscillator comprising:
 an amplifier system including a transistor connected to amplify the signal transmitted therethrough;
 a feedback circuit for the amplifier system, said feedback circuit and said amplifier system including means for causing a phase shift of three hundred sixty degrees in signals transmitted therethrough such that the oscillator will oscillate at a given frequency, said means for causing a phase shift including a variable resistor and an inductor in parallel connection in the emitter circuit of the amplifier;
 means to detect the oscillation frequency of the oscillator; and
 means to vary the phase shift of the amplifier system thereby to vary the oscillation frequency of the oscillator within a predetermined frequency range.

6. A variable frequency sinusoidal oscillator as defined in claim 5 wherein said amplifier system includes a capacitor in series connection with said variable resistor in the emitter circuit.

7. A variable frequency sinusoidal oscillator as defined in claim 4 wherein said feedback circuit includes a variable resistor which when regulated to change the value of said feedback circuit resistance will change the frequency range.

8. A variable frequency sinusoidal oscillator as defined in claim 4 wherein said emitter circuit variable resistance comprises a diode with means to vary the magnitude of electric current passing therethrough thereby varying the resistance level of the diode.

9. A variable frequency sinusoidal oscillator comprising:
 an amplifier system including a transistor with a variable resistor and a capacitor in parallel connection with an inductor in the emitter circuit thereof;
 a feedback circuit connecting the transistor base and collector and including an inductor, a capacitor and a resistor;
 said amplifier system and said feedback circuit causing a phase shift in the signals passing therethrough whereby said oscillator will oscillate at a given frequency;
 means to detect said frequency of oscillation; and
 means to vary the amplifier system resistance value thereby to change the frequency of oscillation of said oscillator within a frequency range.

10. A variable frequency sinusoidal oscillator as defined in claim 9 including means for varying the resistive value of the feedback circuit resistance thereby to change the frequency range through which the oscillation frequency can be varied by varying the amplifier system resistance.

* * * * *